(12) United States Patent
Gerhard et al.

(10) Patent No.: US 10,686,296 B2
(45) Date of Patent: Jun. 16, 2020

(54) OPTOELECTRONIC COMPONENT

(71) Applicant: OSRAM Opto Semiconductors GmbH, Regensburg (DE)

(72) Inventors: Sven Gerhard, Alteglofsheim (DE); Alfred Lell, Maxhütte-Haidhof (DE); Clemens Vierheilig, Tegernheim (DE); Andreas Löffler, Neutraubling (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/764,411

(22) PCT Filed: Sep. 29, 2016

(86) PCT No.: PCT/EP2016/073326
§ 371 (c)(1),
(2) Date: Mar. 29, 2018

(87) PCT Pub. No.: WO2017/055490
PCT Pub. Date: Apr. 6, 2017

(65) Prior Publication Data
US 2019/0052060 A1    Feb. 14, 2019

(30) Foreign Application Priority Data

Oct. 1, 2015  (DE) .................. 10 2015 116 712

(51) Int. Cl.
*H01S 5/22* (2006.01)
*H01S 5/02* (2006.01)
(Continued)

(52) U.S. Cl.
CPC .............. *H01S 5/2205* (2013.01); *H01S 5/22* (2013.01); *H01S 5/3013* (2013.01);
(Continued)

(58) Field of Classification Search
CPC .... H01S 5/2205; H01S 5/3013; H01S 5/3018; H01S 5/343; H01S 5/22; H01S 2301/176; H01S 5/0202; H01S 5/30
(Continued)

(56) References Cited

U.S. PATENT DOCUMENTS 7,724,793 B2   5/2010  Kawakami et al.
8,279,906 B2  10/2012  Kawanishi et al.
(Continued)

FOREIGN PATENT DOCUMENTS

CN    101888059 A    11/2010
CN    101946338 A     1/2011
(Continued)

OTHER PUBLICATIONS

First Office Action dated Aug. 28, 2019, of counterpart Chinese Application No. 201680057942.0, along with an English translation.

*Primary Examiner* — Tuan N Nguyen
(74) *Attorney, Agent, or Firm* — DLA Piper LLP (US)

(57) ABSTRACT

An optoelectronic component includes a layer structure including an active zone that generates electromagnetic radiation, wherein the active zone is arranged in a plane, the layer structure includes a top side and four side faces, the first and third side faces are arranged opposite one another, the second and fourth side faces are arranged opposite one another, a strip-type ridge structure is arranged on the top side of the layer structure, the ridge structure extends between the first side face and the third side face, the first side face constitutes an emission face for electromagnetic radiation, a first recess is introduced into the top side of the layer structure laterally alongside the ridge structure, a second recess is introduced into the first recess, and the second recess extends as far as the second side face.

12 Claims, 13 Drawing Sheets

(51) Int. Cl.
*H01S 5/30* (2006.01)
*H01S 5/022* (2006.01)

(52) U.S. Cl.
CPC .......... *H01S 5/3018* (2013.01); *H01S 5/0202* (2013.01); *H01S 5/0224* (2013.01); *H01S 5/2222* (2013.01); *H01S 2301/176* (2013.01)

(58) Field of Classification Search
USPC .......................................................... 257/14
See application file for complete search history.

(56) References Cited

U.S. PATENT DOCUMENTS

| | | | |
|---|---|---|---|
| 8,335,243 B2 | 12/2012 | Brüninghoff et al. | |
| 8,638,828 B1 * | 1/2014 | Raring .................. | B82Y 20/00 372/43.01 |
| 8,858,030 B2 | 10/2014 | Avramescu et al. | |
| 9,379,521 B2 | 6/2016 | Takagi | |
| 2004/0238828 A1 * | 12/2004 | Ito ........................ | H01S 5/0265 257/79 |
| 2005/0030994 A1 | 2/2005 | Kozaki et al. | |
| 2007/0025231 A1 * | 2/2007 | Ochiai .................. | B82Y 20/00 369/122 |
| 2007/0121692 A1 | 5/2007 | Kawakami et al. | |
| 2007/0264802 A1 | 11/2007 | Sakamoto et al. | |
| 2008/0298405 A1 * | 12/2008 | Korenblit .................. | H01S 1/02 372/28 |
| 2009/0137098 A1 | 5/2009 | Sakamoto et al. | |
| 2010/0301348 A1 | 12/2010 | Kamikawa et al. | |

FOREIGN PATENT DOCUMENTS

| | | | | |
|---|---|---|---|---|
| CN | 104201559 A | | 12/2014 | |
| CN | 104737394 A | | 6/2015 | |
| EP | 1306944 | * | 4/2001 | ............... H01S 5/22 |
| EP | 1 496 584 A2 | | 1/2005 | |
| EP | 1575138 | * | 3/2005 | ............... H01S 5/02 |
| JP | 2000-058965 A | | 2/2000 | |
| JP | 2006-165407 | * | 6/2006 | ............ H01S 5/343 |
| JP | 2006-165407 A | | 6/2006 | |
| JP | 2006-186025 | | 7/2006 | |
| JP | 2008-016584 A | | 1/2008 | |
| JP | 2010-199139 A | | 9/2010 | |
| JP | 2012-243866 A | | 12/2012 | |

* cited by examiner

OPTOELECTRONIC COMPONENT

TECHNICAL FIELD

This disclosure relates to an optoelectronic component.

BACKGROUND

Optoelectronic components, for example, in the form of laser diodes are known. US 2009/0137098 A1 and U.S. Pat. No. 7,724,793 B2 disclose a layer structure comprising an active zone that generates electromagnetic radiation. A ridge structure is arranged on the layer structure, the ridge structure being arranged between two side faces arranged parallel to one another.

There is nonetheless a need to provide an improved optoelectronic component.

SUMMARY

We provide an optoelectronic component including a layer structure including an active zone that generates electromagnetic radiation, wherein the active zone is arranged in a plane, the layer structure includes a top side and four side faces, the first and third side faces are arranged opposite one another, the second and fourth side faces are arranged opposite one another, a strip-type ridge structure is arranged on the top side of the layer structure, the ridge structure extends between the first side face and the third side face, the first side face constitutes an emission face for electromagnetic radiation, a first recess is introduced into the top side of the layer structure laterally alongside the ridge structure, a second recess is introduced into the first recess, the second recess extends as far as the second side face, the first recess extends over an entire length of the laser diode from the first side face as far as the third side face along the second side face, the first recess extends as far as the second side face, the second recess is introduced into a first base face of the first recess, the second recess extends along the second side face, the second recess is configured at a distance from the first side face and at a distance from the third side face, and the second recess leads into the second side face.

LIST OF REFERENCE SIGNS

Figure 1:
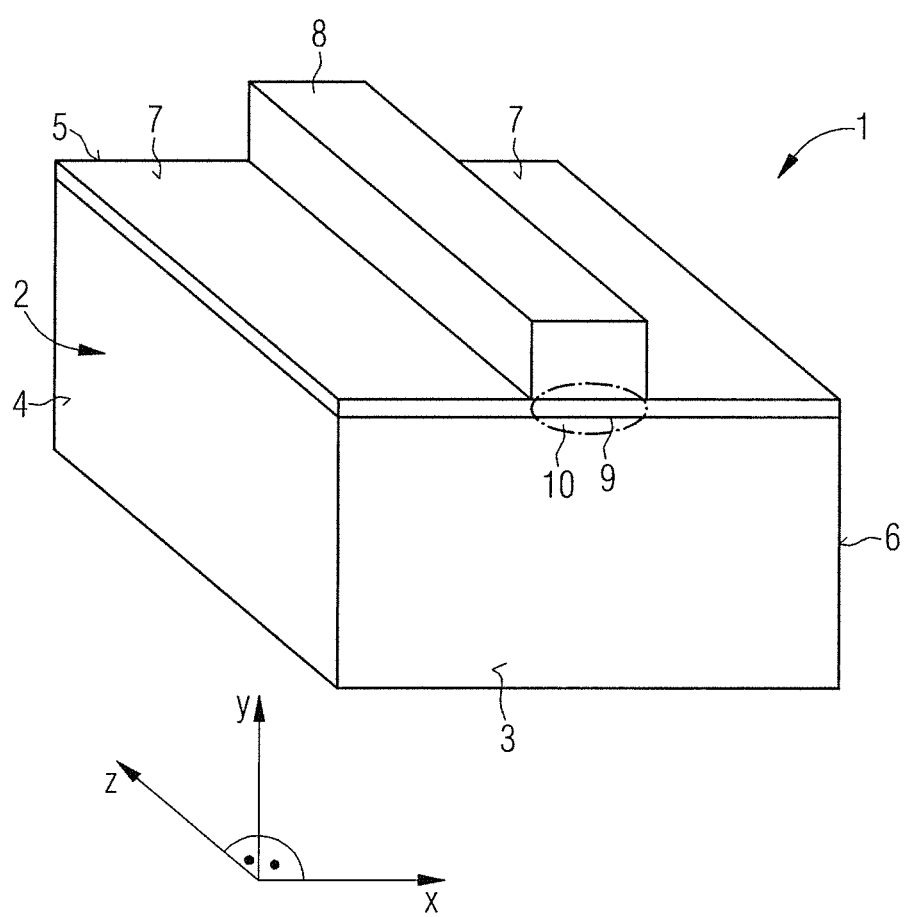
FIG. 1 shows a schematic perspective illustration of an optoelectronic component.

1 Laser diode
2 Layer structure
3 First side face
4 Second side face
5 Third side face
6 Fourth side face
7 Top side
8 Ridge structure
9 Active Zone
10 Laser mode
11 First recess
12 Second recess
13 First base face
14 Second base face
15 Breaking direction
16 Third recess
17 Third base face
18 Wall face
19 Angle
20 Edge
21 Upper section
22 Lower section
23 First wall face
24 Second base face
25 Second wall face
26 Fourth recess
27 Fifth recess
28 Length
31 Seventh recess
32 Seventh base face
33 Seventh wall face
34 Further seventh wall face
35 Distance
36 Carrier
37 Center plane
40 Dislocation
41 $2^{nd}$ Dislocation
42 $3^{rd}$ Dislocation
44 Passivation layer
45 Wall face
46 $1^{st}$ Further wall face
47 $2^{nd}$ Further wall face
48 $3^{rd}$ Further wall face 49 Depth
50 Further sixth wall face
51 Further sixth wall face
52 First separating line
53 Second separating line
54 Wafer

DETAILED DESCRIPTION

Our optoelectronic component comprises a layer structure comprising an active zone that generates electromagnetic radiation, wherein the layer structure comprises a top side and four side faces, a strip-type ridge structure is arranged on the top side of the layer structure, the ridge structure extends between the first side face and the third side face, the first side face constitutes an emission face for electromagnetic radiation, a first recess is introduced into the top side of the layer structure laterally alongside the ridge structure, a second recess is introduced into the first recess, and the second recess extends as far as the second side face. As a result, formation of dislocations in the event of the breaking of the first and/or the third side face is largely avoided. Moreover, in p-down mounting, a leakage current flowing via the side face is reduced.

The first recess may be introduced into the first side face and/or into the third side face, wherein the second recess is introduced into the first side face and/or into the third side face. A further reduction in formation of dislocations in the event of the breaking of the first and/or the third side face may be achieved as a result of the arrangement of the first and/or the third recess in the region of the first and/or the third side face.

At least one third recess may be introduced into a base face of the first recess laterally alongside the ridge structure. A further reduction in formation of dislocations in the event of the breaking of the first and/or the third side face may be achieved as a result.

The third recess may be introduced into the first and/or into the third side face. A further reduction in formation of dislocations in the event of the breaking of the first and/or the third side face is achieved as a result.

The third recess may be arranged substantially parallel to the second side face, wherein the third recess is arranged at a distance from the first side face and at a distance from the third side face.

The first recess may extend along a longitudinal direction of the second side face, wherein the first recess is arranged at a distance from the first side face and at a distance from the third side face.

The first recess may extend over a range of 1% to 99% of a longitudinal side of the second side face. A further reduction in leakage currents flowing via the second side face in p-down mounting is achieved in this way.

The second recess may extend along a longitudinal direction of the second side face, wherein the second recess is arranged at a distance from the first side face and at a distance from the third side face.

The second recess may extend over a range of 1% to 99%, in particular of 50% to 95%, of a longitudinal side of the first side face. A further reduction in leakage currents flowing via the second side face in p-down mounting is achieved in this way.

The second recess may comprise a greater depth relative to a base face of the first recess than the third recess.

The second recess may comprise a depth of 0.5 µm to 50 µm, in particular 1 µm to 10 µm, relative to the top side. A sufficient reduction in leakage currents flowing via the second side face in p-down mounting is reduced in this way.

The second recess may comprise a depth of 2 µm to 6 µm relative to the top side.

The second and fourth side faces may be configured mirror-symmetrically with respect to a center plane, wherein the top sides arranged on opposite sides relative to the ridge structure are configured mirror-symmetrically with respect to the center plane. Leakage currents via the second and third side faces are thus reduced. Furthermore, formation of dislocations at the first and/or at the third side face is reduced further.

At least walls and/or base faces of the first recess and/or of the second recess and/or of the third recess may be covered with a passivation layer. Leakage currents via the side faces may be reduced as a result.

The first recess may extend over an entire length of the laser diode from the first as far as the third side face along the second side face, wherein the first recess extends as far as the second side face, the second recess is introduced into a first base face of the first recess, the second recess extends along the second side face, the second recess is configured at a distance from the first side face and at a distance from the third side face, and the second recess leads into the second side face.

The first recess may extend over an entire length of the laser diode from the first as far as the third side face along the second side face, wherein in the region of the first recess the second side face comprises laterally recessed wall faces, the second recess is introduced laterally into the first recess and into the recessed wall faces, the second recess is introduced into the top side of the layer structure, the second recess extends along the second side face, and the second recess is configured at a distance from the first side face and at a distance from the third side face.

A further recess may be introduced into the first side face and into the top side of the layer structure, wherein the further recess is arranged between the ridge structure and the recessed wall face of the second side face.

The further recess may comprise a base face, wherein the base face is arranged between the top side of the layer structure and a level of the second base face of the second recess.

A second further recess may be introduced into the third side face and into the top side of the layer structure, wherein the second further recess is arranged between the ridge structure and the recessed wall face of the second side face.

The second further recess may comprise a base face, wherein the base face is arranged between the top side of the layer structure and a level of the second base face of the second recess.

The second base face of the second recess may be arranged at the same level as a base face of the first recess.

The above-described properties, features and advantages and the way in which they are achieved will become clearer and more clearly understood in association with the following description of the examples explained in greater detail in association with the drawings.

FIG. 1 shows, in a schematic illustration, an optoelectronic component in the form of a laser diode 1 comprising a layer structure 2. The layer structure 2 comprises four side faces 3, 4, 5, 6. In general, the first side face 3 and the third side face 5 are arranged parallel to one another. Likewise, in general, the second side face 4 and the fourth side face 6 are arranged parallel to one another. A strip-type ridge structure 8 is arranged on a top side 7 of the layer structure 2. The ridge structure 8 extends in a longitudinal direction between the first and third side faces 3, 5. At the first side face 3, an emission face 7 is provided below the ridge structure 8, via which emission face electromagnetic radiation is emitted on the first side face 3.

In a coordinate system comprising an x-axis, a y-axis and a z-axis, which are each perpendicular to one another, the first and third side faces 3, 5 are arranged perpendicularly to the z-axis. The second and fourth side faces 4, 6 are arranged perpendicularly to the x-axis. The top side 7 is arranged perpendicularly to the y-axis. In the example illustrated, the ridge structure 8 is arranged centrally with respect to a width along the x-axis of the top side 7. The ridge structure covers only a part of the width of the top side 7. The ridge structure 8 extends along the z-axis perpendicularly to the first side face 3 from the first side face 3 as far as the third side face 5. Depending on the example chosen, the ridge structure 8 may also end before the plane of the first and/or the third side face 3, 5 or be aligned at an angle of not equal to 90° with respect to the plane of the first and/or the third side face 3, 5. The first and third side faces may comprise mirror layers. Moreover, an insulation layer may be arranged on the top side 7.

The optoelectronic component is configured, for example, as an edge emitting laser diode or as a light-emitting diode (LED). In particular, the laser diode/LED may be produced from a III-V semiconductor material, in particular from indium gallium nitride. The layer structure 2 comprises an active zone 9, which is arranged perpendicularly to the y-axis in a plane and may extend laterally along the x-axis beyond the width of the ridge structure. On account of the ridge structure 8, a guidance of a generated laser mode 10 below the ridge structure 8 in the active zone 9 is achieved. The layer structure 2 may consist of a III-V semiconductor material and be arranged on a carrier. The substrate and/or the layer structure 2 may be based on a III-V compound semiconductor or a II-VI compound semiconductor or zinc oxide. The II-VI compound semiconductor may be a sulfide or a selenide. The III-V compound semiconductor may be based on a nitride compound semiconductor, a phosphide compound semiconductor, an antimonite compound semiconductor or an arsenide compound semiconductor. The III-V compound semiconductor may be, for example, a nitride such as for instance, gallium nitride, indium nitride or aluminum nitride, a phosphide such as for instance, gallium phosphide or indium phosphide a first arsenide such as for instance, gallium arsenide or indium arsenide. In this case, by way of example, the material system $Al_nIn_{1-n-m}Ga_mN$ may be provided, wherein $0 \leq n \leq 1$, $0 \leq m \leq 1$ and $n+m \leq 1$. Moreover, the material system may comprise $Al_nGa_mIn_{1-n-m}P$, wherein $0 \leq n \leq 1$, $0 \leq m \leq 1$ and $n+m \leq 1$. Moreover, the material system may comprise $Al_nGa_mIn_{1-n-m}Sb$, wherein $0 \leq n \leq 1$, $0 \leq m \leq 1$ and $n+m \leq 1$.

During production of the laser diode 1, individual laser diodes 1 are detached from an assemblage, in particular from a wafer, wherein in particular the first and third side faces 3, 5 are produced with the aid of a process of breaking the wafer. The first and third side faces 3, 5 should satisfy conditions stipulated for a good quality of the laser diode 1, in particular constitute a planar face without disturbances and dislocations. Therefore, breaking the first and third side faces 3, 5 is an important process for the quality of the laser diode 1.

Hereinafter, various structures are presented which make possible a process of breaking the first and third side faces 3, 5, wherein a high quality of the first and third side faces 3, 5 is produced.

Figure 2:
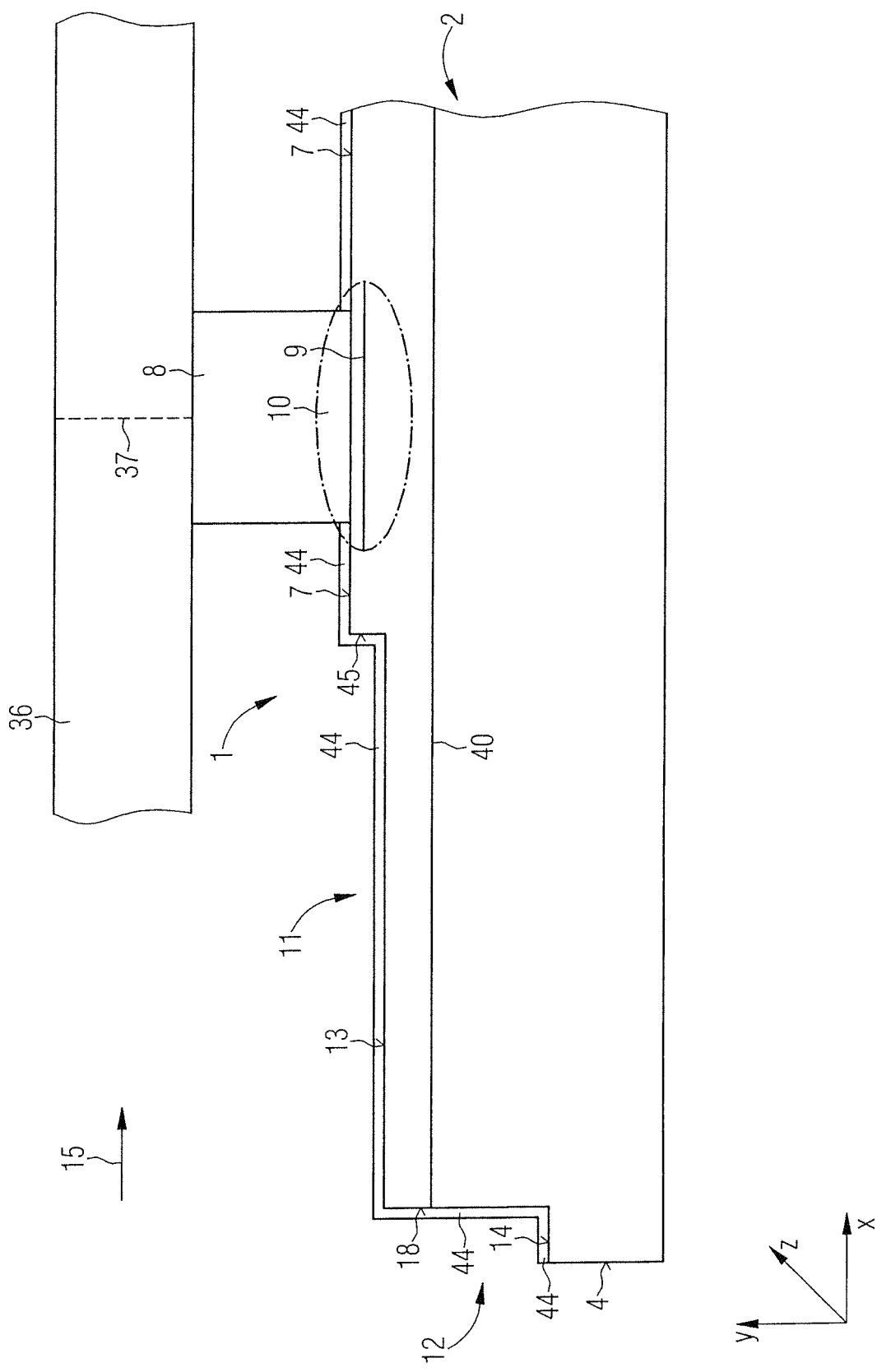
FIG. 2 shows a cross section through a laser diode including two recesses.

FIG. 2 shows a schematic partial cross section through an arrangement comprising a first example of a laser diode 1 in the X-Y plane, which is secured to a carrier 36 by the ridge structure 8 using p-down mounting. The carrier 36 may be configured in the form of a semiconductor substrate. The active zone 9 is arranged in the layer structure 2, wherein with the aid of the ridge structure 8, during operation of the laser diode 1, a laser mode 10 are generated below the ridge structure 8. The laser mode 10 is reflected by the third side face 5 and is at least partly emitted via the first side face 3.

The layer structure 2 comprises a first recess 11 between the ridge structure 8 and the second side face 4 in the top side 7, the first recess extending in the x-axis in the direction of the second side face 4 as far as a second recess 12. The first recess 11 comprises a first base face 13 and extends in the longitudinal direction, that is to say along the z-axis, for example, from the first side face 3 as far as the third side face 5. The first recess 11 may also extend only over a part of the length of the component.

The first base face 13 and side faces 45 of the first recess 11 may be provided with an electrically insulating passivation layer 44. The passivation layer 44 is configured as an oxide layer, for example, and may be produced before the laser diodes are singulated, for example, in an oxidation method using oxygen plasma or water vapor at elevated temperatures. The first base face 13 and the side face 45 of the first recess 11 are constructed from silicon, for example, such that the passivation layer may be formed from silicon oxide. Moreover, the passivation layer may also be formed from $SiN_x$, $TiO_2$ or $Ta_2O_5$.

The second recess 12 extends from the first base face 13 of the first recess 11 via a wall face 18 along the y-axis as far as a second base face 14. The wall face 18 and the second base face 14 may likewise be covered by the passivation layer 44. The second recess 12 may extend in the z-axis from the first side face 3 as far as the third side face 5. Moreover, the second recess 12 may extend along the z-axis only over a part of the length of the laser diode.

The first base face 13 is arranged along the y-axis, for example, in the region of the plane in which the active zone 9 is arranged. In the event of breaking, the layer structure 2 configured as a semiconductor layer structure is broken in a breaking direction 15 from left to right perpendicularly to the z-axis. On account of the first and second recesses 11, 12 in this case transverse facets and/or disturbances at the first side face 3 are avoided or diverted into a region below the laser mode 10. Moreover, the second and/or the fourth side face 4, 6 may likewise be produced by breaking methods or sawing methods or etching methods.

A dislocation 40 is illustrated schematically, the dislocation proceeding from the wall face 18 of the second recess 12 and extending along the x-axis transversely over the width of the laser diode 1. However, the dislocation 40 is arranged below the laser mode 10 and thus cannot impair the quality of the electromagnetic radiation emitted by the laser diode 1.

The top side 7 may be configured mirror-symmetrically with respect to a center plane 37 on both sides of the ridge structure 8. The center plane 37 is arranged parallel to the y-z plane and centrally in the x-direction in the ridge structure 8. The fourth side face 6 may likewise be configured mirror-symmetrically with respect to the center plane 37. Consequently, the fourth side face 6 is provided with corresponding recesses 11, 12 in accordance with the second side face 4.

Figure 3:
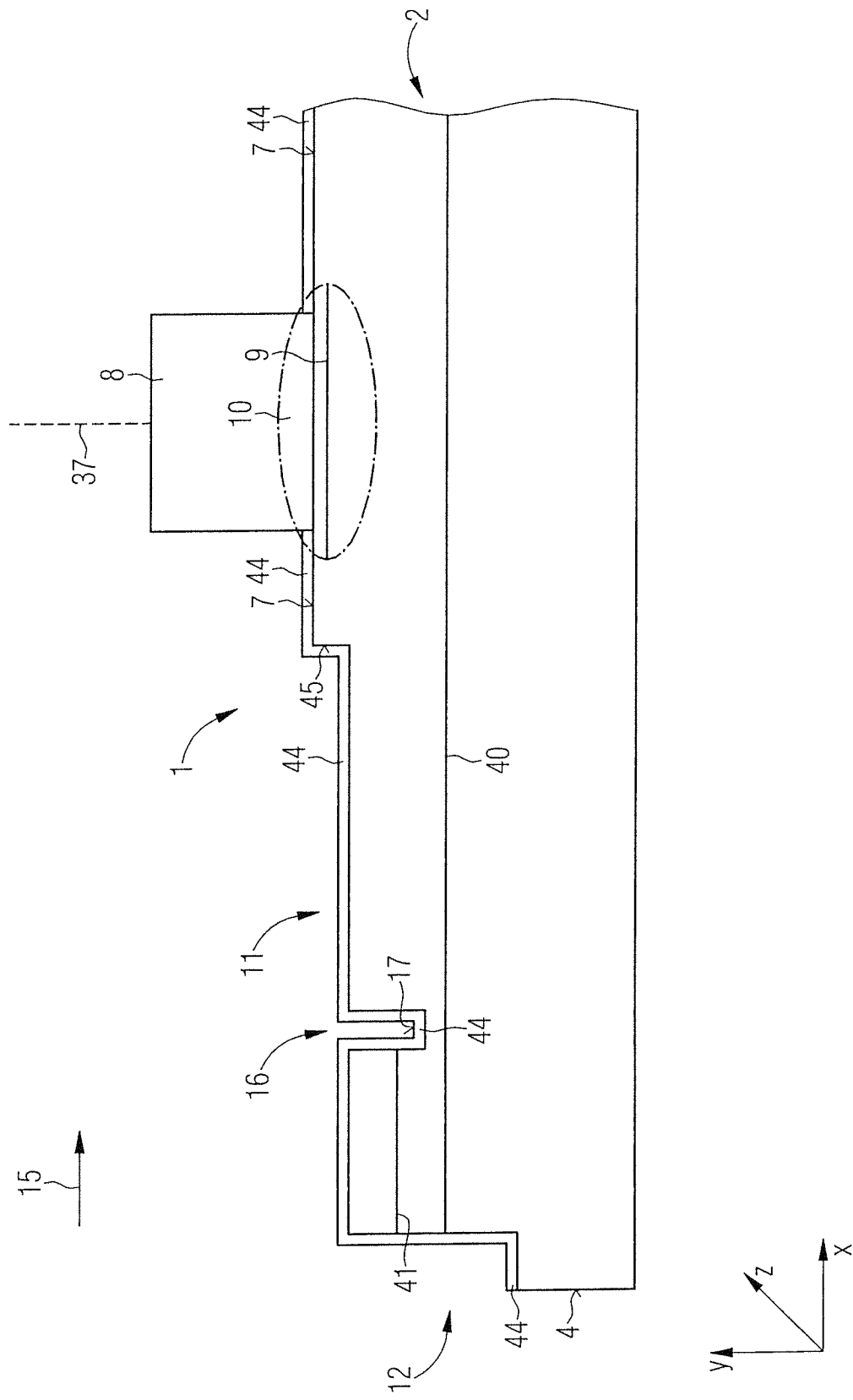
FIG. 3 shows a cross section through a laser diode including three recesses.

FIG. 3 shows a schematic partial cross section of a further example of a laser diode 1 in the x-y plane, wherein a third recess 16 is provided in addition to the first and second recesses 11, 12. The third recess 16 is introduced into the base face 13 of the first recess 11 along the x-axis between the ridge structure 8 and the second recess 12. The third recess 16 may comprise a smaller depth than the second recess 12. Likewise, a third base face 17 of the third recess 16 may be arranged at least in the region of the plane of the active zone 9 or below the plane of the active zone 9. The third recess 16 may extend over the entire length in the z-direction of the laser diode 1 or only over a partial section. Moreover, side faces and the third base face 17 of the third recess 16 may be covered with a passivation layer 44. With the aid of the third recess 16, a further improvement in the quality of the first side face 3 may be achieved in the event of the breaking of the layer structure 2 in the breaking direction 15 from left to right.

With the aid of the third recess 16, transverse facets or disturbances which arise in a deeper region and are produced during breaking may likewise be curbed. A dislocation 40 is illustrated schematically, the dislocation proceeding from the second recess 12 and extending along the x-axis transversely over the width of the laser diode. However, the dislocation 40 is arranged below the laser mode 10 and thus cannot impair the quality of the laser radiation. Moreover, a second dislocation 41 is illustrated, which proceeds from the second recess 12 and extends along the x-axis transversely as far as the third recess 16. The third recess 16 prevents the further formation of the second dislocation 41 in the direction of a region of the laser mode 10.

The first, second and/or third recess 11, 12, 16 may be arranged only in the region of the first and third side faces 3, 5 and may not extend over the entire length of the laser diode in the z-axis. In a further example, the first, the second and/or the third recess 11, 12, 16, depending on the example chosen, may be arranged in the region of the first and third side faces 3, 5 and may extend over the entire length of the laser diode 1 along the z-axis. In a further example, the first, the second and/or the third recess 11, 12, 16 may be arranged only in the region of the first and third side faces 3, 5.

Figure 4:
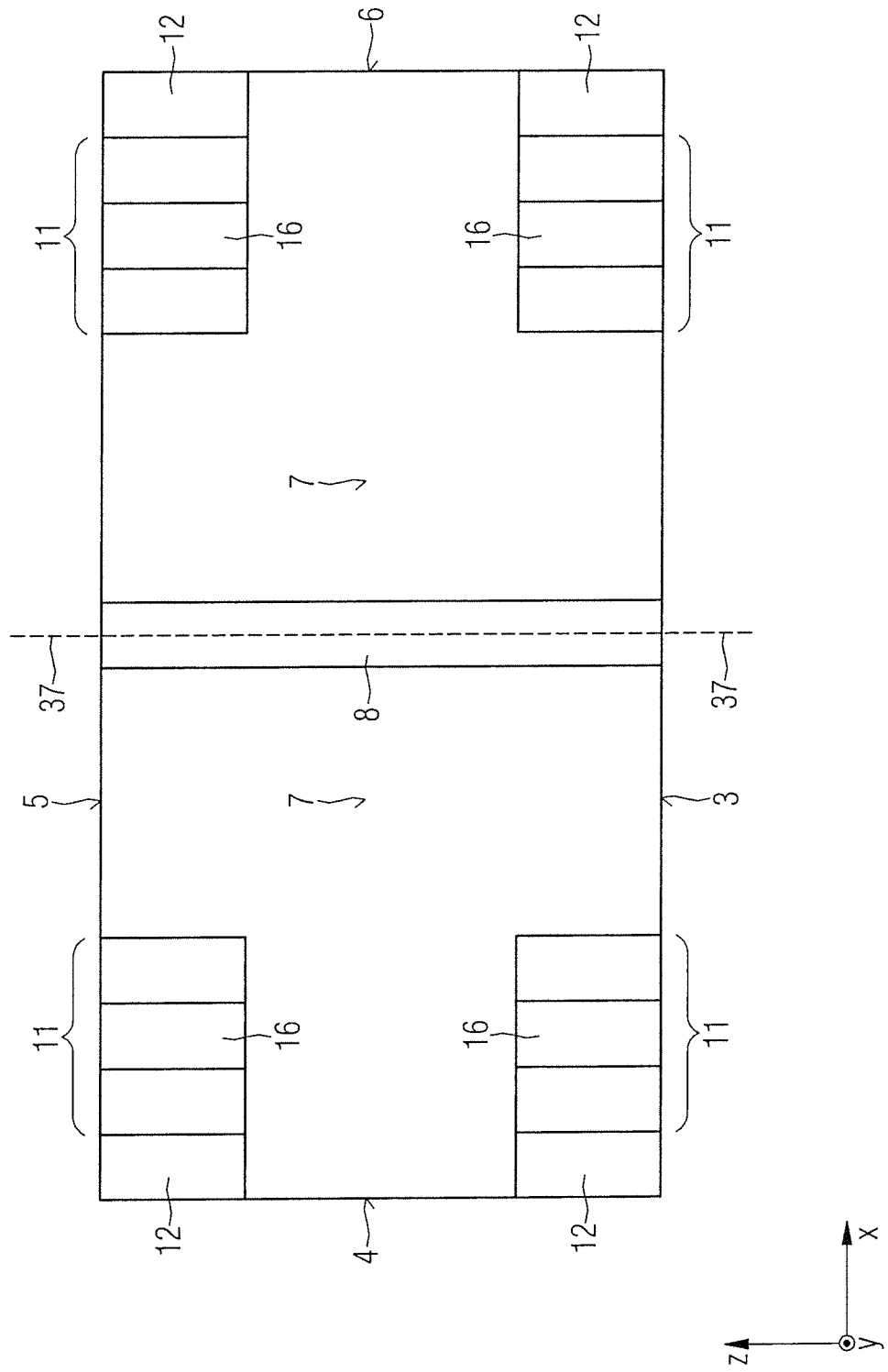
FIG. 4 shows a schematic plan view of a top side of the laser diode.

FIG. 4 shows a view of the example from FIG. 3 in a schematic view from above, wherein the first, second and third recesses 11, 12, 16 are configured in a manner only adjoining the first and third side faces 3, 5. The first, second and third recesses 11, 12, 16 may also extend over the entire length along the z-axis of the layer structure 2. The top side 7 and the second and fourth side faces 4, 6 are configured mirror-symmetrically with respect to the center plane 37. The passivation layer is not explicitly illustrated.

Figure 5:
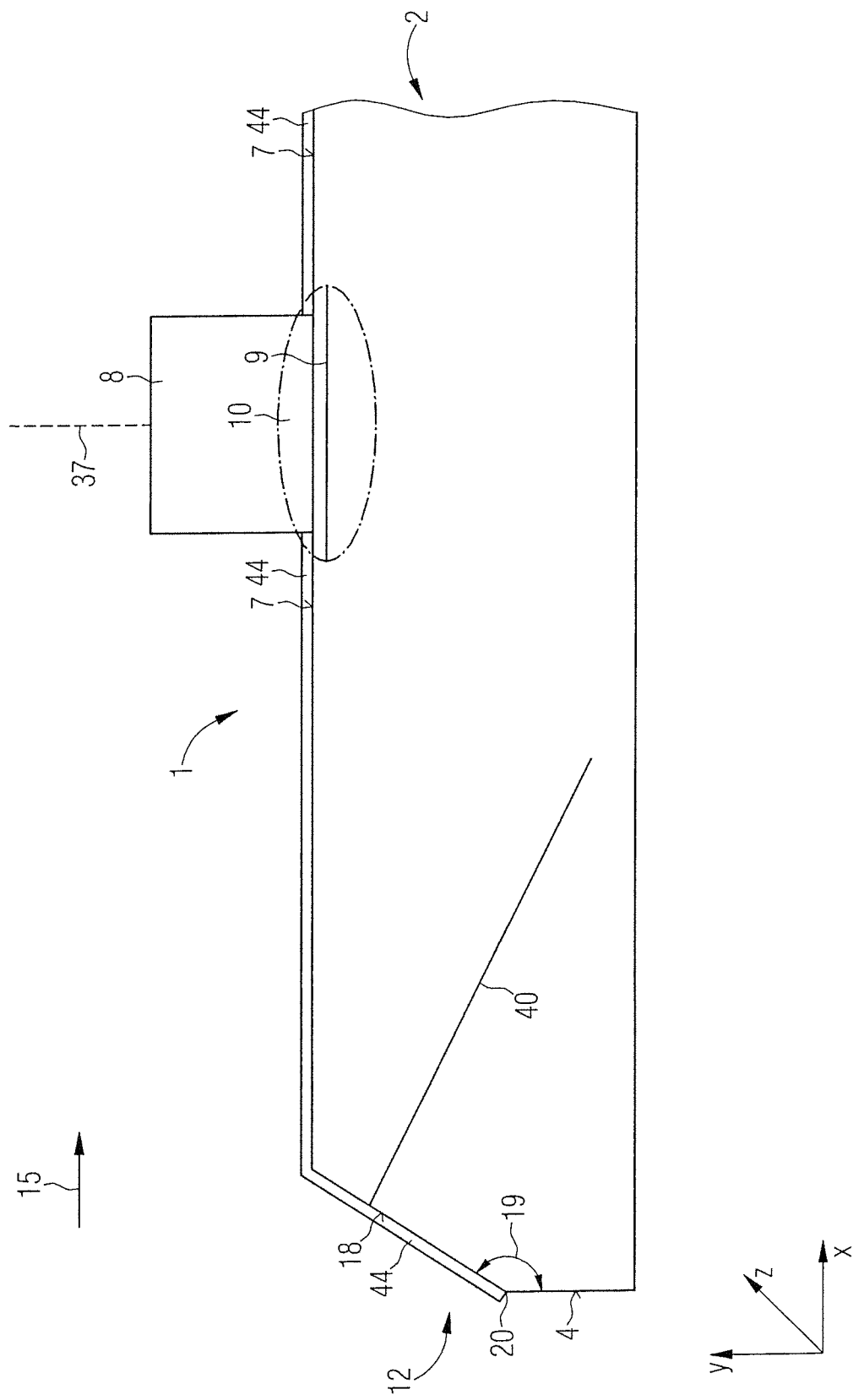
FIG. 5 shows a schematic cross section through a laser diode including a chamfered recess.

FIG. 5 shows a schematic partial cross section in the x-y plane through a further example of a laser diode 1, wherein, in a manner adjoining the second side face 4, a second recess 12 is introduced into the top side 7 of the layer structure 2. The second recess 12 comprises a wall face 18 arranged at an inclination. The wall face 18 may be aligned at an angle 19 of between 91° and 179° relative to the y-axis. In particular, the wall face 18 may be arranged at an angle 19 with respect to the y-axis of 135° to 155°. The second recess 12 may have a depth of 0.5 to 50 µm relative to the top side 7. In particular, the depth of the recess 12 may be 1 to 10 µm, in particular 2 to 6 µm. In this example of the second recess 12, the depth is considered to be a level of an edge 20 on the y-axis at which the wall face 18 transitions into the second side face 4. The edge 20 is aligned along the z-axis. Since dislocations 40 preferably proceed perpendicularly to faces, it is possible to divert disturbances and transverse facets downward by a chamfered second side face 4, as illustrated schematically. The top side 7 and the wall face 18 may be covered with a passivation layer 44. Moreover, the fourth side face 6 of the laser diode 1 may be configured mirror-symmetrically with respect to the second side face 4 in relation to the center plane 37.

Figure 6:
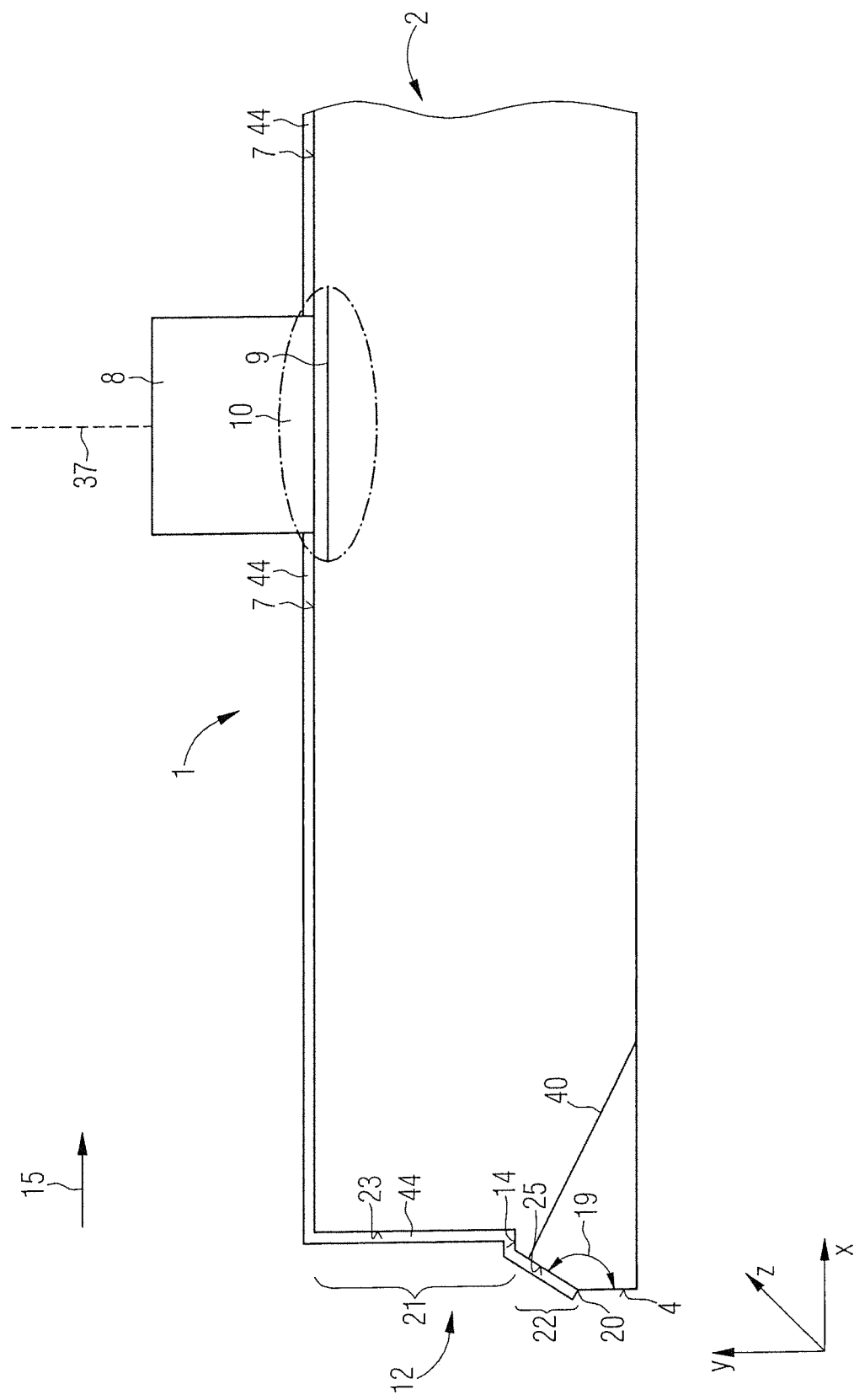
FIG. 6 shows a schematic cross section through a further example of a laser diode including a recess which is configured partly perpendicularly and partly in a chamfered fashion.

FIG. 6 shows a partial cross section through a further example of a laser diode 1 in the y-x plane comprising a second recess 12, which comprises a first wall face 23 at the second side face 4 in an upper section 21, the first wall face being arranged parallel to the y-axis. The first wall face 23 transitions into a second base face 14. The second base face 14 does not extend as far as the second side face 4 in the x-axis, but rather transitions into a second wall face 25 in a lower section 22.

The second wall face 25 is configured in the form of an inclined face that is at an angle 19 relative to the y-axis that may be 91° to 179°, in particular 135° to 155°. Consequently, in this example, a lower section 22 of the second recess 12 is arranged at an inclination with respect to the y-axis. Consequently, dislocations 40 or transverse facets produced in the lower region, in particular, may be diverted into deeper regions. The top side 7 and/or the first wall face and/or the second wall face and/or the second base face 14 may be covered with a passivation layer 44. Moreover, the fourth side face 6 of the laser diode 1 may be configured mirror-symmetrically with respect to the second side face 4 in relation to the center plane 37.

Figure 7:
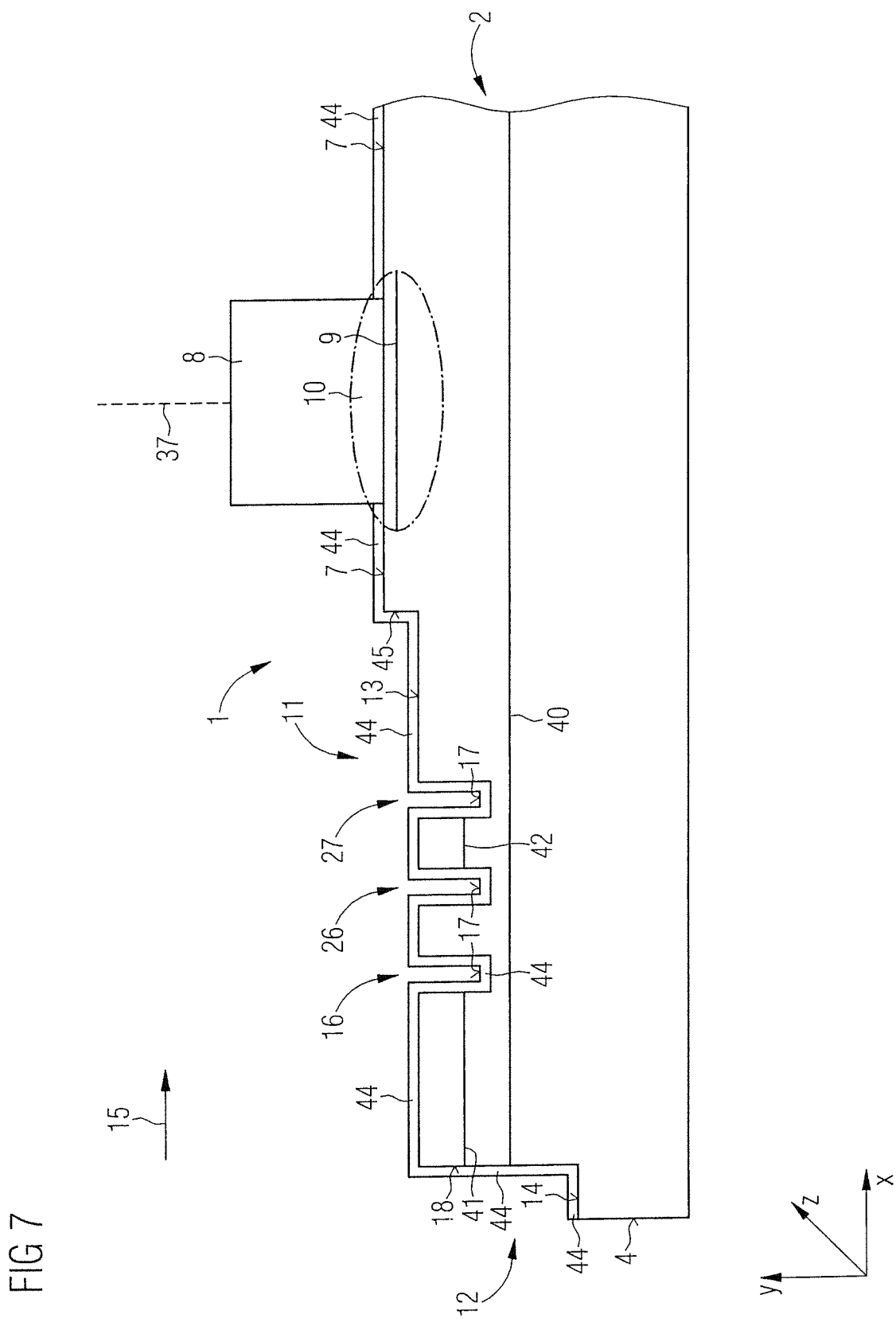
FIG. 7 shows a schematic cross section through a further example of a laser diode including a plurality of third recesses.

FIG. 7 shows a partial cross section through a further example of a laser diode 1 in the y-x plane that substantially corresponds to the example from FIG. 3, wherein, however, a fourth and a fifth recess 26, 27 are additionally introduced into the first base face 13 of the first recess 11. The fifth recess 27 may be dispensed with or a plurality of recesses may also be provided. The fourth and fifth recesses 26, 27 may be configured in accordance with the third recess 16. Providing the fourth and fifth recesses 26, 27 makes it possible to curb further transverse facets 41 arising between the third recess 16 and the fourth recess and/or between the fourth and fifth recesses 26, 27. The depths of the third recess 16 and of the fourth and fifth recesses 26, 27 may be different. Moreover, the wall faces of the third recess 16 and of the fourth and fifth recesses 26, 27 may also be arranged at an inclination with respect to the y-axis, as was explained on the basis of the examples in FIGS. 5 and 6.

The top side 7 and/or the wall face 18 of the second recess 12 and/or the second base face 14 of the second recess 12 and/or the walls and base faces of the third and/or the fourth and/or the fifth recess 16, 26, 27 may be covered with a passivation layer 44. Moreover, the fourth side face 6 of the laser diode 1 may be configured mirror-symmetrically with respect to the second side face 4 relative to the center plane 37. Furthermore, the top side 7 arranged between the ridge structure 8 and the fourth side face 6 may also comprise a third, a fourth and a fifth recess and may be configured mirror-symmetrically with respect to the center plane 37.

Figure 8:
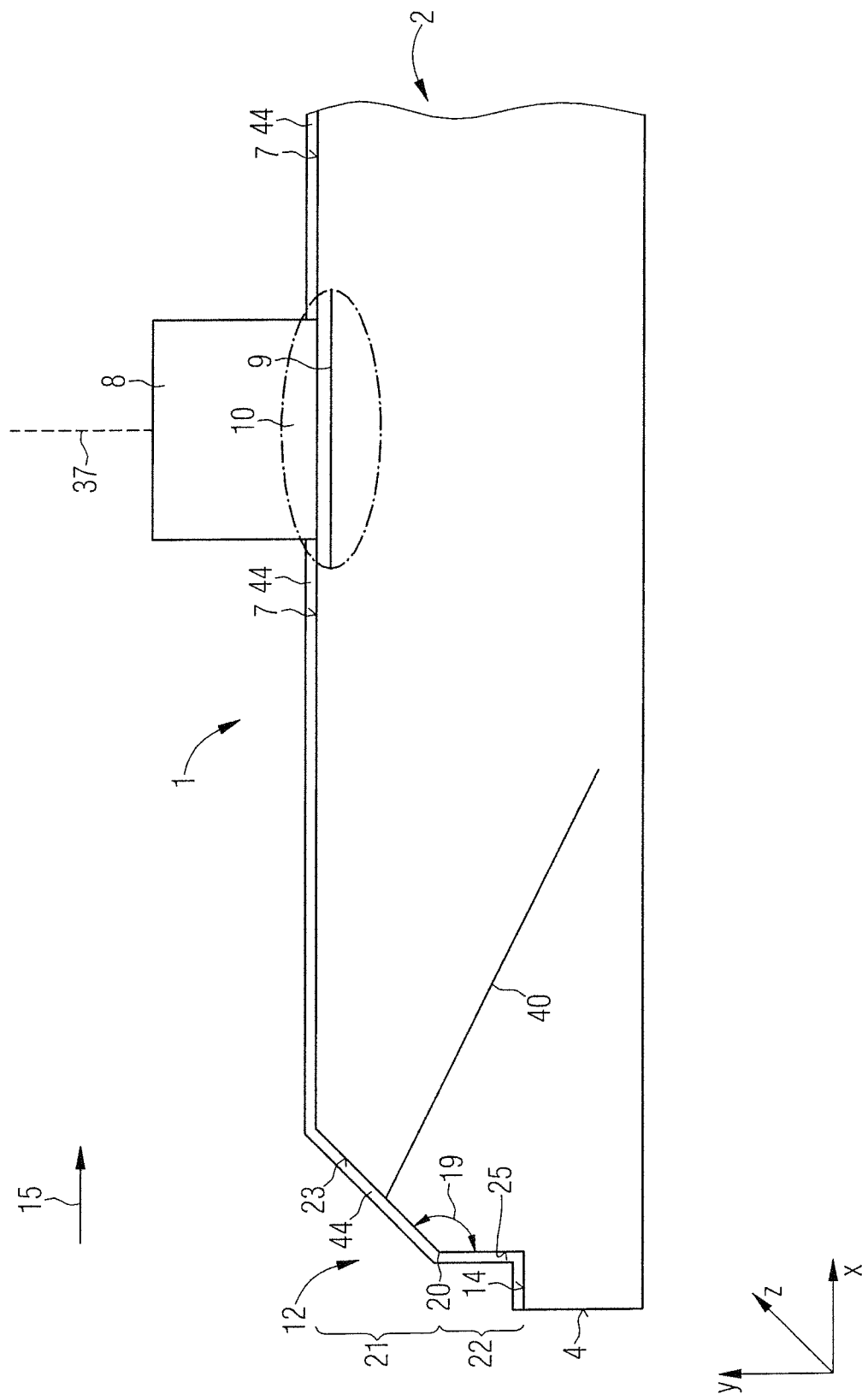
FIG. 8 shows a cross section through a further example of a laser diode including a partly perpendicular and partly chamfered sidewall.

FIG. 8 shows a partial cross section through a further example of a laser diode 1 in the y-x plane comprising a second recess 12. The second recess 12 comprises a first wall face 23 in an upper section 21, the first wall face being arranged at an angle 19 at an inclination with respect to the y-axis. The angle 19 may be 91° to 179°, in particular 135° to 155°. The first wall face 23 transitions via an edge 20 into a lower section 22 and a second wall face 25. The edge 20 is made parallel to the z-axis in particular over the entire length of the laser diode 1. The second wall face 25 is arranged parallel to the y-axis. The second wall face 25 transitions via a second base face 14 into the second side face 4 in the direction of the x-axis. Consequently, in this example, by the first wall face 23 arranged at an inclination, disturbances and transverse facets 40 that may arise during breaking are diverted downward outside the region of the laser mode 10. The top side 7 and/or the first and/or the second wall face 23, 25 and/or the second base face 14 of the second recess 12 may be covered with a passivation layer 44. Moreover, the fourth side face 6 of the laser diode 1 may be configured mirror-symmetrically with respect to the second side face 4 relative to the center plane 37.

Figure 9:
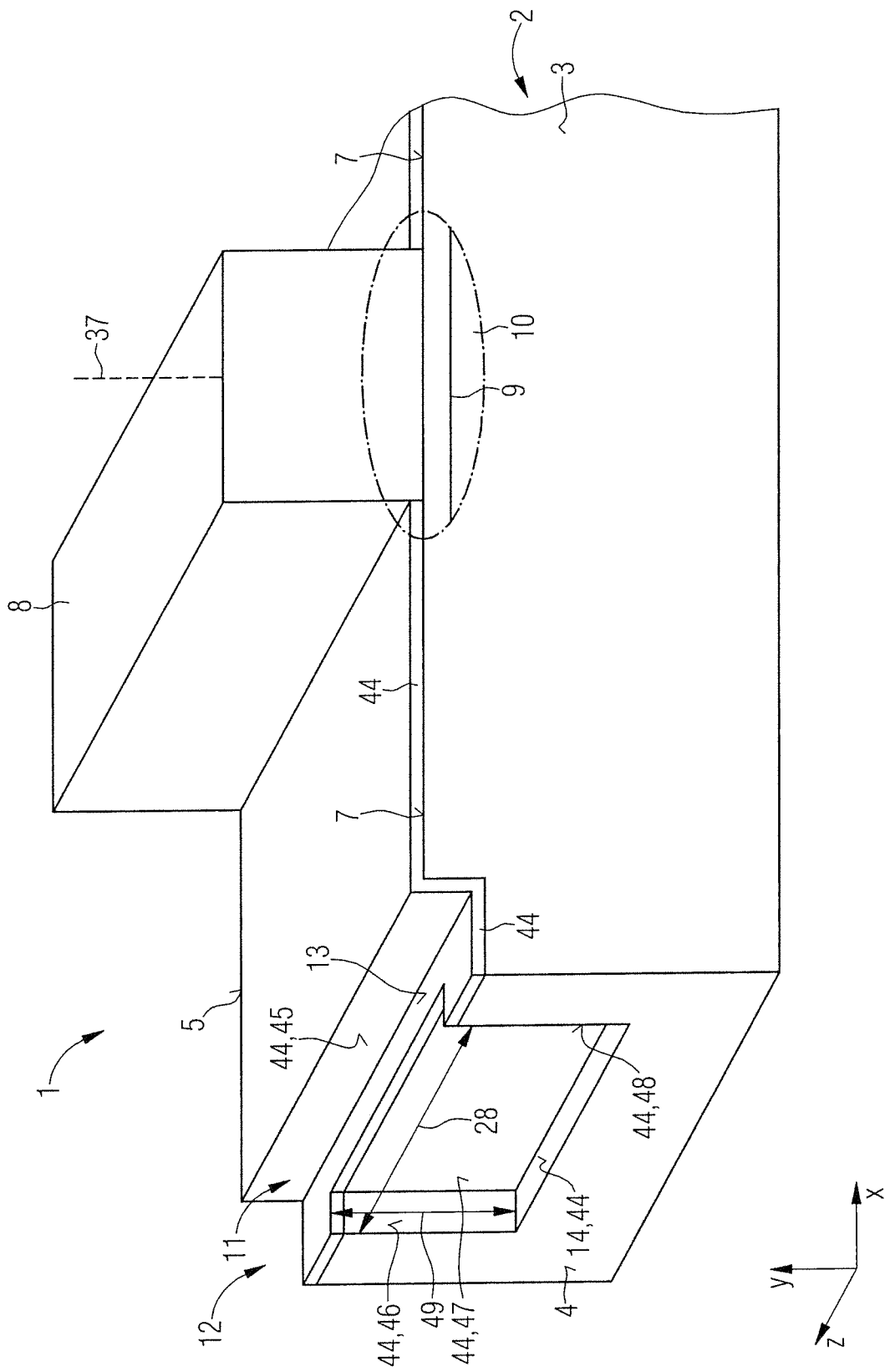
FIG. 9 shows a schematic perspective illustration of a further example of a laser diode including a recess at the second sidewall.

FIG. 9 shows, in a schematic perspective illustration, a partial section of a further example of a laser diode 1 with a view of the first side face 3, wherein a first recess 11 comprising a first base face 13 is configured in the top side 7. The first recess 11 extends in the z-direction, for example, over the entire length of the laser diode 1 or only over a part of the entire length of the laser diode 1. Consequently, the first recess 11 may be configured in the form of a stepped gradation. The first recess 11 comprises a first wall face 45 and a first base face 13. The first wall face 45 may be arranged perpendicularly to the top side 7. The first base face 13 may be arranged parallel to the top side 7. The wall face 45 and/or the first base face 13 may be covered with a passivation layer 44.

A second recess 12 is introduced into the first base face 13 of the first recess 11. The second recess 12 extends in the x-direction as far as the second side face 4. Consequently, the second recess 12 is opened in the first base face 13 and in the second side face 4. The second recess 12 comprises three further wall faces 46, 47, 48 and a second base face 14. The second base face 14 is arranged, e.g., parallel to the first base face 13. The first wall face 46 is arranged in a manner offset inward relative to the third side face 5. The first wall face 46 may be arranged parallel to the third side face 5. The third wall face 48 is arranged in a manner offset inward relative to the first side face 3. The third wall face 48 may be arranged parallel to the first side face 3. The three further wall faces 46, 47, 48 and the second base face 14 may be covered with a thin passivation layer 44, which changes the shape of the second recess 12 only insignificantly. The second recess 12 is arranged between the first and third side faces 3, 5 and at a distance from the first and third side faces 3, 5 in the example illustrated. The first and third side faces 3, 5 constitute facet faces.

The second recess 12 may also extend as far as the first and third side faces 3, 5 and may be configured in the form of a second stepped gradation. Moreover, the second recess 12 may also be arranged only in the region of the first and third side faces 3, 5. In this example, the first recess 11, proceeding from the top side 7, comprises a depth parallel to the Y-axis of 0.5 to 25 µm. The second recess 12 comprises a depth 49 with respect to the first base face 13 of the first recess 11 which is in the range of 0.5 µm to 50 µm, for example, 1 µm to 10 µm, in particular 2 µm to 6 µm. The first base face 13 may be arranged above or below the active zone 9.

The length 28 of the second recess 12 parallel to the z-axis may extend 5% to 100% of the entire length of the laser diode 1 parallel to the z-axis. In the case of a length of 100%, the second recess 12 comprises only one second further wall face 47 and a second base face 14. In particular, the length 28 of the second recess may extend 50% to 99% of the length of the laser diode 1 parallel to the z-axis. Moreover, the length 28 of the second recess 12 may extend 80% to 97% along the z-axis of the laser diode. The second recess 12 may be arranged symmetrically and centrally with respect to the length of the laser diode in the z-direction. With the aid of these examples, it is possible to reduce leakage currents in the case of p-down mounting, in which the ridge structure 8 is mounted on a carrier, on account of the first and second recesses 11, 12 and/or the passivation layer 44. Moreover, dislocations in the event of the breaking of the first and/or the third side face 3, 5 are reduced as a result the recesses 11, 12. Moreover, the fourth side face 6 of the laser diode 1 may be configured mirror-symmetrically with respect to the second side face 4 relative to the center plane 37.

Figure 10:
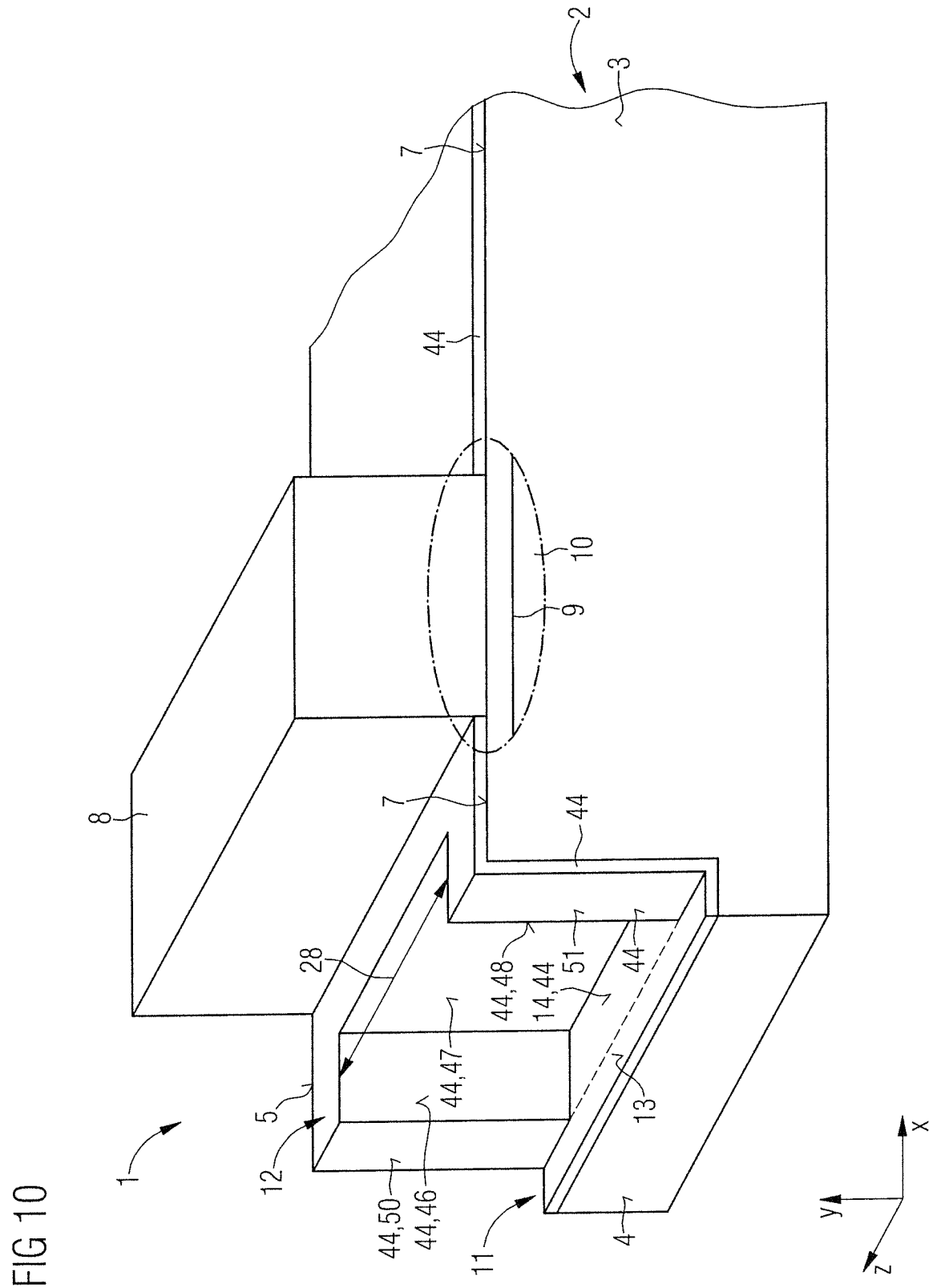
FIG. 10 shows a schematic perspective illustration of a further example of a laser diode including a recess on the third side face.

FIG. 10 shows a perspective partial illustration of a further example of a laser diode 1 with a view of the first side face 3. A first recess 11 is introduced into the top side 7, the first recess directly adjoining the second side face 4 and extending from the first side face as far as the third side face 3, 5. The first recess 11 comprises a first base face 13, which is arranged, e.g., parallel to the top side 7. Moreover, the first recess 11 is delimited by two further sixth wall faces 50, 51. The two further sixth wall faces 50, 51 additionally constitute inwardly recessed parts of the second side face 4. Consequently, the first recess 11 forms a lateral stepped gradation of the first side face 4.

A second recess 12 is introduced into the top side 7 and into the first recess 11. A boundary between the first recess 11 and the second recess 12 is illustrated in a dashed manner on the first base face 13. Moreover, the second recess 12 adjoins the further wall faces 50, 51 of the second side face 4. The second recess 12 comprises three further wall faces 46, 47, 48 and a second base face 14. The second recess 12 is arranged between the first and third side faces 3, 5 and at a distance from the first and third side faces 3, 5. In this example, the first recess 11 and the second recess 12 comprise the same depth along the Y-axis. The second recess 12 comprises a depth with respect to the top side 7 which is 0.5 µm to 50 µm, for example, 1 µm to 10 µm, in particular 2 µm to 6 µm.

The length 28 of the second recess 12 parallel to the z-axis may extend 5% to 100% of the entire length of the laser diode 1 parallel to the z-axis. The second recess 12 may be arranged centrally with respect to the longitudinal extent of the laser diode 1. In a length of 100%, the second recess 12 comprises only one second further wall face 47 and a second base face 14. In particular, the length 28 of the second recess 12 may extend 50% to 99% of the length of the laser diode 1 parallel to the z-axis. Moreover, the length 28 of the second recess 12 may extend 80% to 97% along the z-axis of the laser diode. With the aid of these examples, it is possible to reduce leakage currents in the case of p-down mounting, in which the ridge structure 8 is mounted on a carrier, on account of the first and second recesses 11, 12 and/or the passivation layer 44. Moreover, dislocations in the event of the breaking of the first and/or the third side face 3, 5 are reduced as a result the recesses 11, 12. Moreover, the fourth side face 6 of the laser diode 1 may be configured mirror-symmetrically with respect to the second side face 4 relative to the center plane 37 and may comprise a corresponding first and second recess 11, 12. The first and second recesses 11, 12 of the fourth side 6 may also comprise different shapes or dimensions than the first and second recesses 11, 12 of the second side 4.

The three further wall faces 46, 47, 48 and the second base face 14 of the second recess 12 and the first base face 13 and the further sixth wall faces 50, 51 may be covered with a passivation layer 44.

An at least partly passivated second side face 4 having laterally different widths, e.g., is thinner in the region of the first and third side faces, enables a combination with a deep mesa structure with additional recesses in the region of the first and third side faces 3, 5, even if the active zone 9 is situated very close to a side face of the layer structure and is, for example, at a distance of less than 50 µm in an asymmetrical ridge position. As a result, it is possible to reduce leakage currents in p-down mounting, in which the ridge structure 8 is mounted on a carrier. Moreover, transverse facets and/or disturbances may be curbed. Moreover, the fourth side face 6 of the laser diode 1 may be configured mirror-symmetrically with respect to the second side face 4 relative to the center plane 37.

Figure 11:
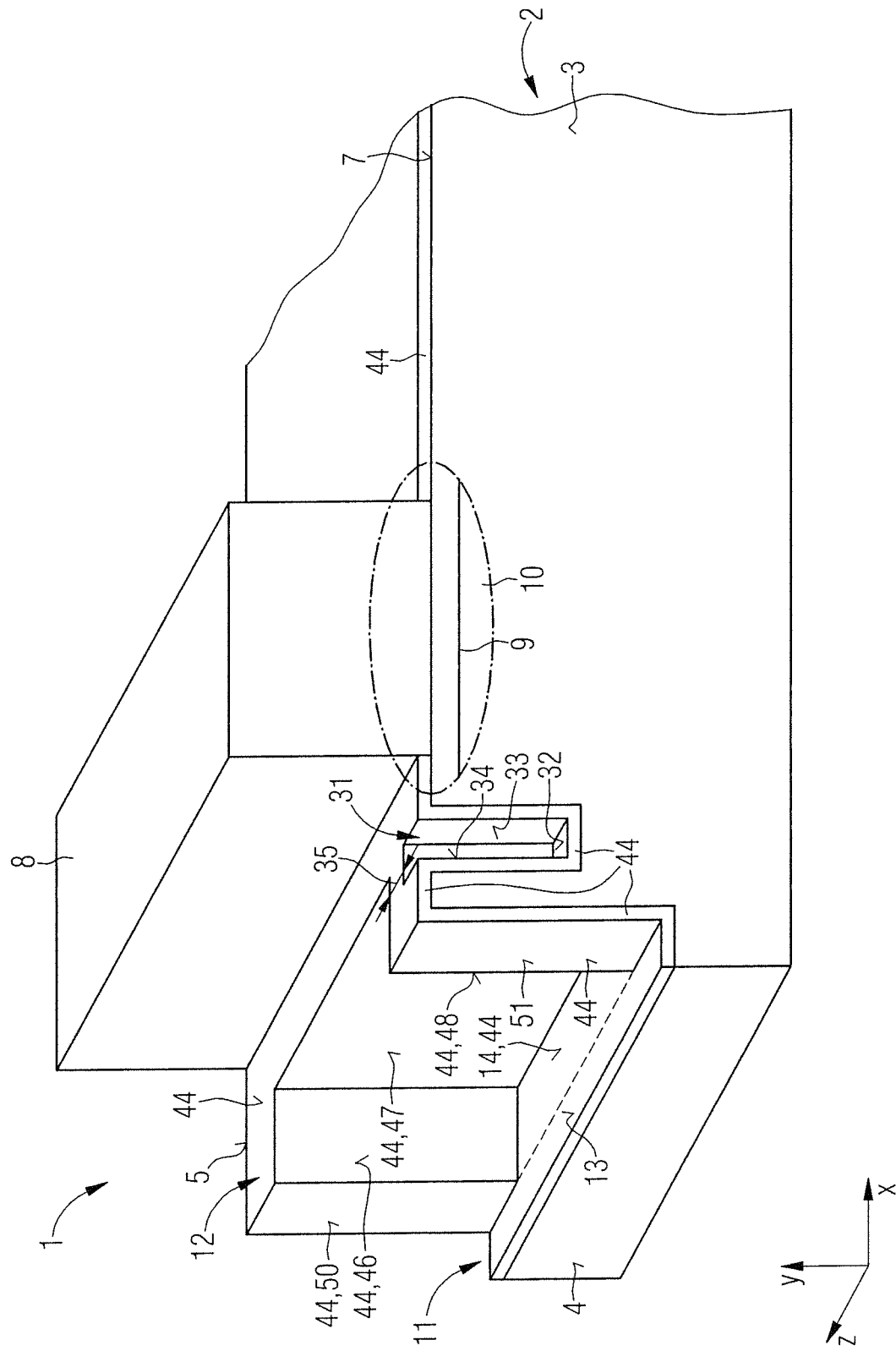
FIG. 11 shows a schematic perspective illustration of a laser diode including a recess on the third side face and on the first side face.

FIG. 11 shows a partial illustration of one example of a laser diode 1 with a view of the first side face 3, which substantially corresponds to the example from FIG. 10. In this case, however, a seventh recess 31 is additionally provided, which is introduced into the top side 7 of the layer structure 2 in the region of the first side face 3. The seventh recess 31 comprises a seventh base face 32. The seventh base face 32 is arranged between the top side 7 and the second base face 14 of the second recess 12. Moreover, the seventh recess 31 extends in the x-axis right into a region in which the second recess 12 is also formed in an offset manner laterally in the z-axis. The seventh recess 31 additionally affords the possibility of curbing transverse facets and disturbances in the event of the breaking of the laser diode 1 or in the event of the breaking of the first side face 3. A seventh recess 31 as in the first side face 3 may also be arranged on the third side face 5.

The second recess 12 with the wall face 18 is at a distance from the ridge structure 8 which is the same or smaller or larger compared to the seventh recess 31 with a seventh wall face 33 facing the ridge structure 8 or is aligned parallel to the z-axis. Moreover, the seventh recess 31 comprises a further seventh wall face 34 situated opposite the seventh wall face 33. The further seventh wall face 34 is at a greater distance from the ridge structure 8 than the wall face 18 of the second recess 12. The second and seventh recesses 12, 31 are at a distance 35 from one another in the z-direction. The faces of the seventh recess 31 may be covered with a passivation layer 44.

On the top side 7 of the laser diode 1, an insulation layer 40 is applied on both sides of the ridge structure 8 such that a current flow to the region of the ridge structure 8 is limited. Moreover, the second and fourth side faces 4, 6 and also the recesses are covered with a passivation layer 44. The three further wall faces 46, 47, 48 and the second base face 14 of the second recess 12 and the first base face 13 and the further sixth wall faces 50, 51 may be covered with a passivation layer 44. The passivation layer 44 is produced, e.g., with the aid of a chemical conversion, in particular by an oxidation of the material of the side faces. The side faces 4, 6 are composed of silicon, for example, wherein the passivation layer consists of silicon oxide.

Figure 12:
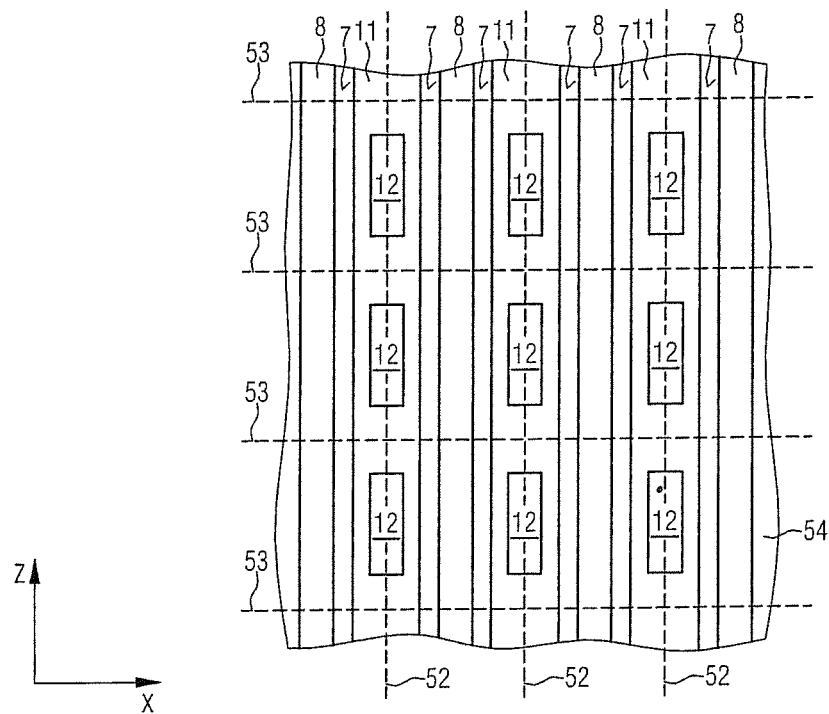
FIG. 12 shows a schematic plan view of a part of a wafer including components according to FIG. 9 before the components are singulated.

FIG. 12 shows a schematic plan view of a part of a wafer 54 comprising components in accordance with FIG. 9 before the components are singulated. In this case, first separating lines 52 and second separating lines 53 are illustrated as dashed lines. The first separating lines 52 run parallel to the strip-type ridge structures 8. The second separating lines 53 run perpendicularly to the ridge structures 8.

The first recesses 11 are configured as parallel strips. The second recesses 12 are configured as strips arranged in parallel lines. First separating lines 52 and second separating lines 53 are illustrated as dashed lines. The first separating lines 52 run parallel to the strip-type ridge structures 8 through the middle of the first and second recesses 11, 12. The second separating lines 53 each run perpendicularly to the ridge structures 8 between two second recesses 12. The second separating lines 53 define the first and third side faces of a component. The first separating lines 52 define the second and fourth side faces of the components. The components are singulated in accordance with the separating lines 52, 53. In this case, the wafer 54 is broken along the second separating lines 53. The wafer 54 may likewise be broken along the first separating lines 52. In the example illustrated, the first recess 11 extends over an entire length of a component. The second recess 12 extends only over a part of the length of a component.

Figure 13:
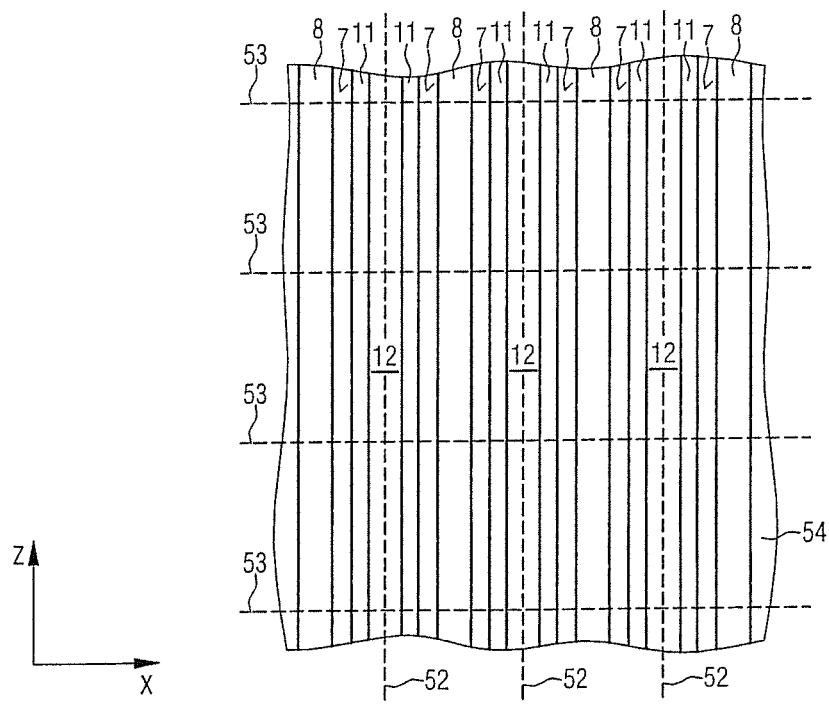
FIG. 13 shows a schematic plan view of a part of a wafer with a further example of components before the components are singulated.

FIG. 13 shows a schematic plan view of a part of a wafer 54 comprising a further example of components before the components are singulated. In this case, first separating lines 52 and second separating lines 53 are illustrated as dashed lines. The first separating lines 52 run parallel to the strip-type ridge structures 8. The second separating lines 53 run perpendicularly to the ridge structures 8.

The first recesses 11 are configured as parallel strips. The second recesses 12 are configured as parallel strips. First separating lines 52 and second separating lines 53 are illustrated as dashed lines. The first separating lines 52 run parallel to the strip-type ridge structures 8 through the middle of the second recesses 12. The second separating lines 53 each run perpendicularly to the ridge structures 8 between two second recesses 12.

The second separating lines 53 define the first and third side faces of a component. The first separating lines 52 define the second and fourth side faces of the components. The components are singulated in accordance with the separating lines 52, 53. In this case, the wafer 54 is broken along the second separating lines 53. The wafer 54 may likewise be broken along the first separating lines 52. The components are configured substantially in accordance with FIG. 12, wherein in this example, however, the second recesses 12 extend over the entire length of the components.

Figure 14:
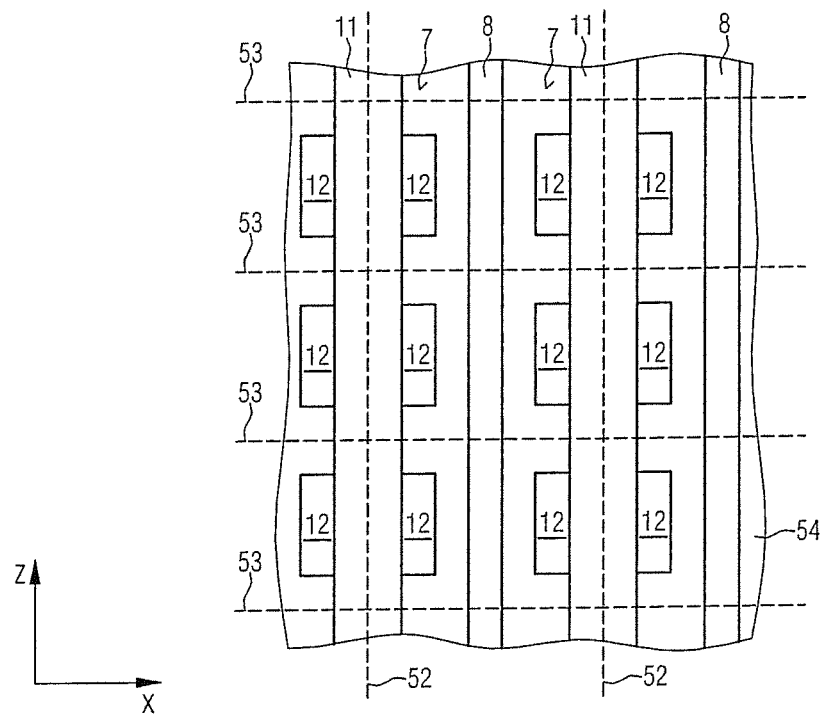
FIG. 14 shows a schematic plan view of a part of a wafer including components according to FIG. 10 before the components are singulated.

FIG. 14 shows a schematic plan view of a part of a wafer 54 comprising components in accordance with FIG. 10 before the components are singulated. The ridge structures 8 are arranged parallel to one another.

The first recesses 11 are configured as parallel strips. The second recesses 12 are configured as strips arranged in parallel lines. First separating lines 52 and second separating lines 53 are illustrated as dashed lines. The first separating lines 52 run parallel to the strip-type ridge structures 8 through the middle of the first recesses 11. The second separating lines 53 run perpendicularly to the ridge structures 8 in each case between two second recesses 12.

The second separating lines 53 define the first and third side faces of a component. The first separating lines 52 define the second and fourth side faces of the components. The components are singulated in accordance with the separating lines 52, 53. In this case, the wafer 54 is broken along the second separating lines 53. The wafer 54 may likewise be broken along the first separating lines 52. The first recesses 11 extend over the entire length of the components. The second recesses 12 extend only over a part of the length of the components.

Figure 15:
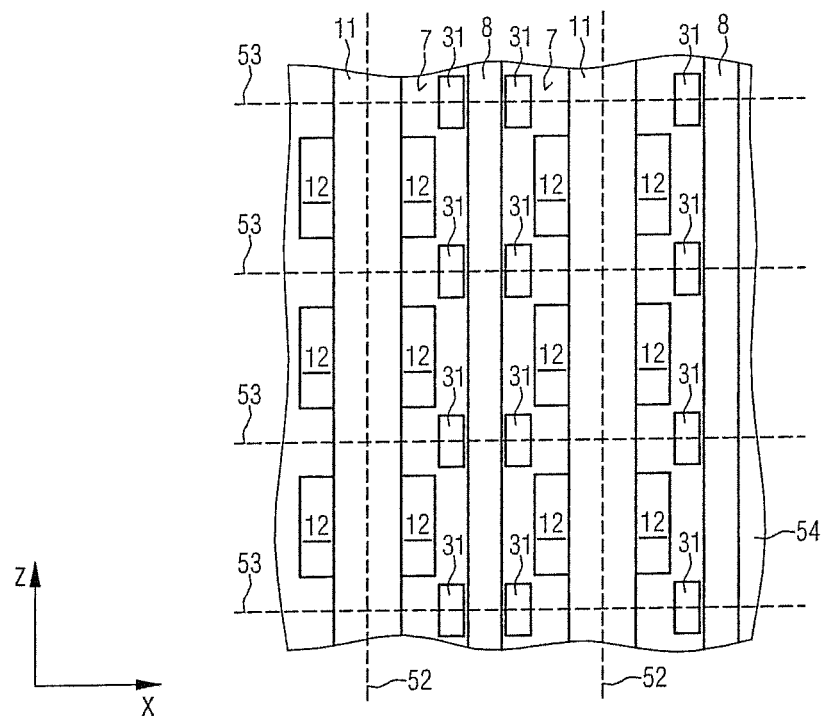
FIG. 15 shows a schematic plan view of a part of a wafer including components according to FIG. 11 before the components are singulated.

FIG. 15 shows a schematic plan view of a part of a wafer 54 comprising components in accordance with FIG. 11 before the components are singulated. The arrangement is as in FIG. 14, wherein seventh recesses 31 are additionally provided as well. The ridge structures 8 are arranged parallel to one another. In this case, first separating lines 52 and second separating lines 53 are illustrated as dashed lines. The first recesses 11 are configured as parallel strips. The second recesses 12 are configured as strips arranged in parallel lines. First separating lines 52 and second separating lines 53 are illustrated as dashed lines. The first separating lines 52 run parallel to the strip-type ridge structures 8 through the middle of the first recesses 11. The second separating lines 53 run perpendicularly to the ridge structures 8 in each case between two second recesses 12 and centrally through seventh recesses 31.

The second separating lines 53 define the first and third side faces of a component. The first separating lines 52 define the second and fourth side faces of the components. The components are singulated in accordance with the separating lines 52, 53. In this case, the wafer 54 is broken along the second separating lines 53. The wafer 54 may likewise be broken along the first separating lines 52. The seventh recesses 31 are arranged on the second separating lines 53.

Although our components have been more specifically illustrated and described in detail by preferred examples, this disclosure is not restricted by the examples disclosed and other variations may be derived therefrom by those skilled in the art, without departing from the scope of protection of the appended claims.

This application claims priority of DE 10 2015 116 712.3, the subject matter of which is incorporated herein by reference.

The invention claimed is:

1. An optoelectronic component comprising:
a layer structure comprising an active zone that generates electromagnetic radiation, wherein the active zone is arranged in a plane, the layer structure further comprising a top side and four side faces, the first and third side faces arranged opposite one another, the second and fourth side faces arranged opposite one another,
a strip-type ridge structure is arranged on the top side of the layer structure, the ridge structure extending between the first side face and the third side face, the first side face constituting an emission face for electromagnetic radiation,
a first recess having a first wall face and a first base face disposed on the top side of the layer structure laterally alongside the ridge structure, the first wall face arranged perpendicularly to the top side, and the first base face arranged parallel to the top side, the first recess extending over an entire length of the component from the first side face to the third side face along the second side face, the first recess extending to the second side face,
a second recess disposed in the first base face of the first recess, the second recess having a smaller length than the first recess relative to the length of the component from the first side face and the third side face, the second recess extending to and along the second side face, and the second recess disposed symmetrically and centrally with respect to the length of the component at a distance from the first side face and at a distance from the third side face.

2. The component according to claim 1, wherein at least one third recess is introduced into the first base face of the first recess laterally alongside the ridge structure.

3. The component according to claim 1, wherein at least one third recess is introduced into the first base face of the first recess laterally alongside the ridge structure, and the third recess is introduced at least into the first or the third side face.

4. The component according to claim 1, wherein at least one third recess is introduced into the first base face of the first recess laterally alongside the ridge structure, the third recess is arranged substantially parallel to the second side face, and the third recess is arranged at a distance from the first side face and at a distance from the third side face.

5. The component according to claim 1, wherein the second recess extends 1% to 99% of a longitudinal side of a second side face.

6. The component according to claim 1, wherein at least one third recess is introduced into the first base face of the first recess laterally alongside the ridge structure, and the second recess comprises a greater depth relative to the first base face of the first recess than the third recess.

7. The component according to claim 1, wherein the second recess comprises a depth of 0.5 µm to 50 µm relative to the top side.

8. The component according to claim 1, wherein the second recess comprises a depth of 0.5 µm to 50 µm, and the second recess comprises a depth of 2 µm to 6 µm relative to the top side.

9. The component according to claim 1, wherein at least the second side face and the fourth side face are mirror-symmetrically configured, on both sides, with respect to a center plane, or the top sides arranged on opposite sides relative to the ridge structure are mirror-symmetrically configured with respect to the center plane.

10. The component according to claim 1, wherein the component is a laser diode.

11. The component according to claim 10, wherein the laser diode is produced from a III-V semiconductor material.

12. The component according to claim 10, wherein the laser diode is produced from indium gallium nitride.

* * * * *